United States Patent [19]

Gaulier

[11] 4,450,048
[45] May 22, 1984

[54] METHOD OF MANUFACTURING CAPACITORS INTEGRATED IN MICROELECTRONIC STRUCTURE

[75] Inventor: Yves Gaulier, Herouville, France

[73] Assignee: U.S. Philips Corporation, New York, N.Y.

[21] Appl. No.: 510,531

[22] Filed: Jul. 5, 1983

[30] Foreign Application Priority Data

Jul. 9, 1982 [FR] France .............................. 82 12137

[51] Int. Cl.³ ...................... C25D 11/04; C25D 11/12
[52] U.S. Cl. ........................................ 204/15; 204/42
[58] Field of Search ...................... 204/15, 33, 42, 58

[56] References Cited

U.S. PATENT DOCUMENTS

| | | | |
|---|---|---|---|
| 3,461,347 | 8/1969 | Temelson | 204/15 |
| 3,785,937 | 1/1974 | McMahon | 204/15 |
| 3,864,217 | 2/1975 | Takahata | 204/15 |
| 4,157,610 | 6/1979 | Kamei | 204/15 |

Primary Examiner—T. M. Tufariello
Attorney, Agent, or Firm—Jack E. Haken; James J. Cannon, Jr.

[57] ABSTRACT

A method of manufacturing MOM capacitors, the dielectric and the lateral insulation of which are formed by islands and by vertical partition walls, respectively, obtained by local anodic oxidation of one of the plates of said capacitors. The islands and the vertical partition walls are formed from cavities provided in the plates of the said capacitors.

4 Claims, 4 Drawing Figures

METHOD OF MANUFACTURING CAPACITORS INTEGRATED IN MICROELECTRONIC STRUCTURE

BACKGROUND OF THE INVENTION

1. Field of the Invention

The invention relates to a method of manufacturing capacitors integrated in a microelectronic structure at the surface of a semiconductor body, the plates of these capacitors being formed from two metal layers which are superimposed, are insulated at least in part from said semiconductor body and are mutually separated by a layer of an insulating material, the dielectric of the said capacitors and their lateral insulation being formed by means of islands and vertical partition walls, respectively, obtained by local anodic oxidation of the lower metal layer. The invention also relates to the device obtained by means of this method.

2. Description of the Prior Art

In order to form capacitors within an integrated microelectric structure, use is preferably made of the so-called thin film technique, the capacitors formed by means of this technique having a larger capacitance per unit surface area and considerably smaller resistances than the diffused junction capacitances that may also be utilized. Moreover, the capacitance of the thin film capacitors does not depend upon the applied voltage, as is the case with the capacitance of the semiconductor junctions.

In these capacitors, the insulator that has been used recently as a dielectric in fact is an oxide layer obtained from the metal constituting at least one of the plates.

In most cases, this dielectric is consequently alumina formed from the aluminum constituting the plates, the alumina being an oxide characterized by a high permittivity, which eliminates substantially entirely the risk of lack of insulation.

The method most frequently used for forming the dielectric is known as method of anodic oxidation, which consists in that a suitable voltage is applied between a layer of an anodically oxidizable metal and an electrode immersed in a suitably chosen electrolyte.

This solution, which is of particular importance when so-called "MOM" (Metal-Oxide-Metal) capacitors should be manufactured, because the dielectric layer can be formed in the first deposited metal layer, requires a suitable choice not only of the metal constituting the plates, most frequently aluminum, but also of the composition of the electrolyte employed. It is known indeed that given solutions used as electrolyte, such as, for example, oxalic acid and aethylene-glycol, lead to the formation of a porous layer of alumina during the anodization of a layer of aluminum, while other solutions, especially on the basis of tartaric acid, yield a tight layer of alumina.

It goes without saying that, in order to avoid the diffusion of the metal constituting the plates of the capacitor through its dielectric, the latter must advantageously be constituted by a tight oxide layer.

Generally, the metal plates of the capacitors are formed during the process of shaping the connection networks covering the surface of the semiconductor body carrying the integrated micro-structure.

If the latter comprises a plurality of capacitors, which may be identical, at the same level, its manufacture has consequently become more complex. In this case, therefore, the problems of insulation between the said capacitors and the problems of contacting should be taken into consideration, which problems are connected inter alia with the space required and can be solved with greater difficulty as the surface of the said integrated microstructure is smaller.

A solution consists in that for the assembly use is made of a plate formed from a first metal layer deposited on an insulating layer covering the surface of the semiconductor body which carries the integrated micro-structure, the other plate of each of the said capacitors being obtained from a second metal layer, and in that at least the said first metal layer is subdivided into different parts of configurations chosen beforehand by means of insulating transverse partition walls formed from its surface.

Said partition walls may be obtained by means of a groove provided in the metal layer(s) and may be filled with silicon oxide, but they are preferably obtained by local anodic oxidation of the first metal layer which also serves to obtain a plate of the capacitors and generally to obtain connection networks.

After the capacitors and the connection networks have been formed at the surface of the semiconductor body, the latter has finally to be subjected to a step of polishing its back surface opposite the so-called active surface carrying the active or passive elements of the integrated structure.

This polishing step serves to obtain the desired thickness of the semiconductor body and it is effected while using the active surface and the layer covering it as a reference surface.

In the modern structures, under the influence of the pressure exerted on the reference surface, the dielectric local islands separating the plates of the capacitors as well as the vertical partition walls insulating said capacitors from each other are pressed slightly into the metal layer in which they have been formed and may then be damaged.

This phenomenon, which becomes manifest especially at the periphery of the said islands and/or the said partition walls, may produce short circuits between the plates of the same capacitors or between the plates of adjacent capacitors.

A solution used to obviate this disadvantage consists in that the dielectric layer or the insulating partition walls are covered with a supplementary insulating layer, which consequently causes deposition and photo-etching steps to be added to the existing mode of operation and increases the complexity of the method.

SUMMARY OF THE INVENTION

The invention has for its object to mitigate these difficulties and for this purpose takes into account the phenomena occurring during the photo-etching steps.

The invention further has for its object to provide MOM capacitors that can be integrated in a multi-layer structure by operations which are simple, reproducible and compatible with the simultaneous formation of the other elements of the said structure, said capacitors having to present a high permittivity value.

For this purpose, according to the invention use is made of the known method of anodic oxidation of a metal of good electrical conductivity immersed in a suitable electrolyte solution and subjected to the influence of an external voltage, whose value determines the capacitive characteristics of the capacitors.

Therefore, the invention relates to a method of manufacturing capacitors integrated in a microelectronic structure at the surface of a semiconductor body, the plates of these capacitors being obtained from two metal layers which are superimposed, are insulated at least in part from the said semiconductor body and are mutually separated by a layer of an insulating material, the dielectric of the said capacitors and their lateral insulation being formed by means of islands and vertical partition walls, respectively, obtained by local anodic oxidation of the lower metal layer, which method is more particularly characterized in that, after deposition of said lower metal layer and of the layer of insulating material covering it, through a first series of apertures provided in said layer of insulating material, recesses are locally provided in this metal layer so that cavities are formed therein, in which the dielectric layers in the form of islands of the capacitors are formed by anodic oxidation, and in that then through a second series of apertures provided in the same layer of insulating material new recesses are provided in the lower metal layer, in which the vertical partition walls are formed, thus giving the lower plates of the capacitors their ultimate form by insulating them simultaneously electrically from each other.

The first advantage of this method consists in that it does not require supplementary deposition and/or photo-etching steps: therefore, the same apertures provided in the layer of insulating material for etching the metal layer are used for the anodic oxidation of said layer.

Secondly, when carrying out this method, the fact is automatically utilized that a lateral etching designated as under-etching, occurs simultaneously with the transverse etching. This etching, which extends under the layer of insulating material causes the local island of anodized oxide to be completely protected at its periphery, especially when a pressure is exerted at the surface during the last operations for obtaining the desired thickness.

Advantageously, the plates of the capacitors are formed from aluminum layers and consequently the dielectric of the said capacitors and their vertical insulating partition walls consist of alumina, the said dielectric consisting of tight alumina and the insulating partition walls generally consisting of porous alumina.

Preferably, the tight alumina formed by anodization is obtained from a solution of tartaric acid, while the porous alumina, which is likewise formed by anodization, is obtained from a solution of oxalic acid.

These anodization operations are effected at low temperature so that the physical and electrical properties of the structure comprising the capacitors are not changed.

The invention further relates to the device obtained by the method described above and comprising an integrated structure of active and passive elements, at the surface of which a plurality of capacitors has been formed which are insulated from each other by vertical insulating partition walls and the plates of each of which are separated by an island-shaped dielectric layer, the dielectric layer and the vertical insulating partition walls having been obtained by local anodic oxidation of a superficial layer of the lower plate of the said capacitors through apertures provided in a layer of insulating material covering in the said plate, which device is more particularly characterized in that the outer surface of the local islands constituting the dielectric layer and that of the vertical insulating partition walls present at least in part a difference in level with respect to the surface of the lower plate of the capacitors, and in that the layer of insulating material covering the said lower plate is at right angles to the periphery of the recesses thus formed.

BRIEF DESCRIPTION OF THE DRAWINGS

In order that the invention may be readily carried out, it will now be described more fully, by way of example, with reference to the accompanying drawings, in which.

DESCRIPTION OF THE PREFERRED EMBODIMENT

Figure 1:
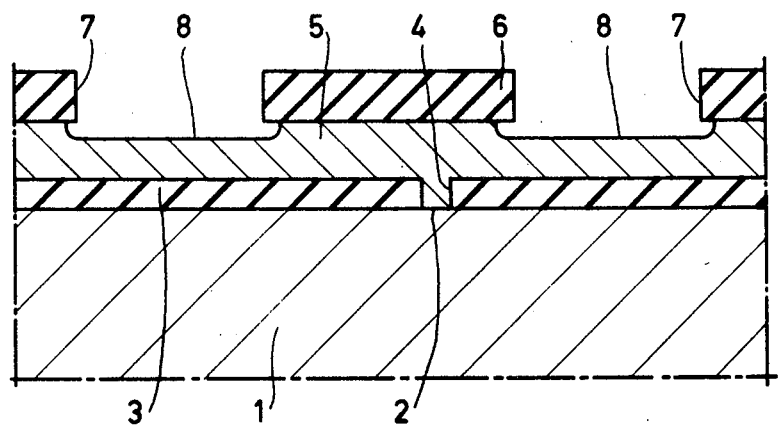
FIGS. 1 to 4 show diagrammatically and in sectional view various stages of the manufacture of a semiconductor device comprising a plurality of MOM capacitors obtained by the method according to the invention.

It should be noted that in the Figures the dimensions are strongly exaggerated and disproportionate for the sake of clarity of the drawings.

In the embodiment shown in FIGS. 1 to 4, the starting member is a semiconductor wafer 1 in which active and passive elements are formed, which are not shown in the Figures.

At the surface 2 of the said wafer, a first insulating layer 3, generally of $SiO_2$, is deposited, in which apertures 4 are provided which are required for contacting said active and passive elements.

Subsequently, the surface of the insulating layer 3 and the apertures 4 are covered with an aluminum layer 5 constituting the metal layer in which the lower plates of the capacitors to be manufactured will be formed. This metal layer serves also to form a first layer of connection networks in contact with the active and passive elements of the device through the apertures 4.

After having formed said connection networks, the following step consists in that the assembly is covered with a second layer 6 of insulating material in which apertures 7 are provided, through which the subjacent metal layer 5 is then chemically attacked.

Due to this chemical attack, the recesses 8 are obtained, whose periphery is at right angles to the layer of insulating material 6 (FIG. 1) due to the phenomenon designated as under-etching.

Figure 2:
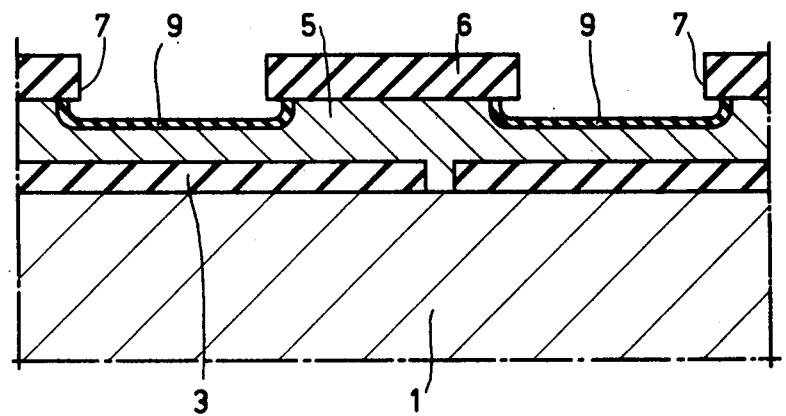

The surface, which is exposed in the recesses 8, is then subjected to anodization so that the layers 9 of tight alumina are obtained, which constitute the dielectric layer of the MOM capacitors to be manufactured (FIG. 2). These layers 9 of alumina are formed in an aqueous solution of 30 g/l of tartaric acid having a pH=1.8 at a voltage chosen in dependence upon the thickness to be obtained at 10 Å/V: said voltage is chosen in this embodiment to be about 25 V.

Figure 3:
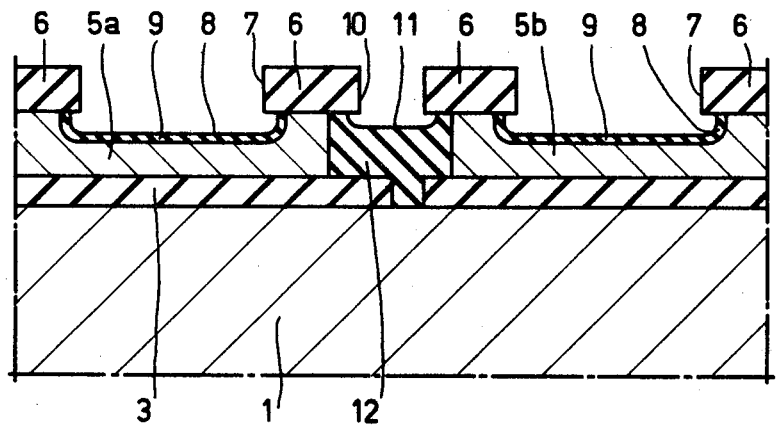

After the formation of the dielectric layer 9, new apertures 10 are provided in the layer of insulating material 6. These apertures 10 are situated between the apertures 7 which have already been provided and through the said apertures 10 a chemical attack is first effected, by which recesses 11 can be obtained, from which the local islands 12 of porous alumina, which in fact determine the configuration of the lower plates 5a, 5b . . . and hence of the plurality of MOM capacitors according to the invention (FIG. 3). These insulating islands 12 traverse the whole thickness of the metal layer 5 and are obtained, for example, by anodization in a solution of 80 g/l of oxalic acid.

Figure 4:
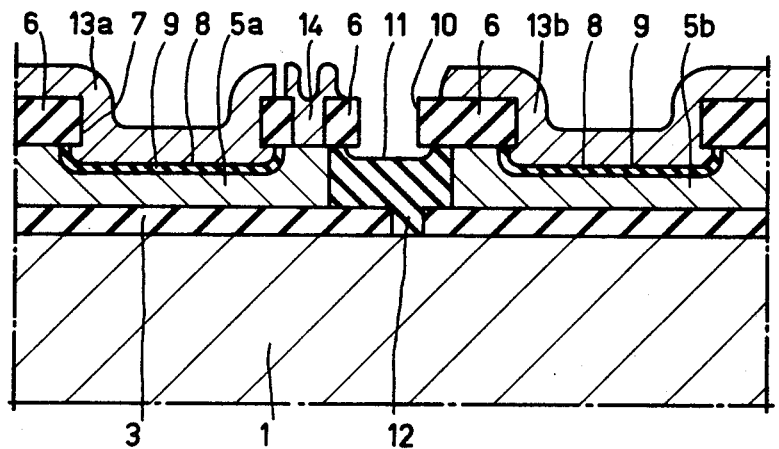

The last steps leading to the representation of FIG. 4 consist in that then the second plates 13a, 13b of the said capacitors, the contacts 14 on the first plate and a new layer of connection networks are then formed from a second layer, generally of aluminum, deposited on the surface of the assembly and photo-etched in a suitable manner.

Thus, it appears from FIG. 4 that consequently a succession of capacitors has been obtained at the surface of the integrated structure, the series or parallel arrangement of the said capacitors then being realized by means of external connections.

What is claimed is:

1. A method of manufacturing capacitors integrated in a microelectronic structure at the surface of a semiconductor body, the plates of these capacitors being obtained from two metal layers which are superimposed, are insulated at least in part from the said semiconductor body and are mutually separated by a layer of insulating material, the dielectric of the said capacitors and their lateral insulation being formed by means of islands and vertical partition walls, respectively, obtained by local anodic oxidation of the lower metal layer, which method is characterized in that, after deposition of the said lower metal layer and of the layer of insulating material covering it, through a first series of apertures provided in the said layer of insulating material, local recesses are provided in this metal layer in order to form therein cavities, in which the dielectric layers in the form of islands of the capacitors are then formed, and in that then through a second series of apertures provided in this same layer of insulating material new recesses are provided in the lower metal layer, in which the vertical partition walls are formed, thus giving the lower plates of the capacitors their ultimate form by insulating them simultaneously electrically from each other.

2. A method as claimed in claim 1, characterized in that the plates of the capacitors are formed from aluminum layers, and in that the dielectric of the said capacitors and their vertical insulating partition walls consist of alumina.

3. A method as claimed in claim 2, characterized in that the dielectric layers of the capacitors consist of tight alumina, and in that the vertical insulating partition walls consist of porous alumina.

4. A device obtained by the method claimed in any one of claims 1 to 3 and comprising an integrated structure of active and passive elements, at the surface of which a plurality of capacitors has been obtained, which are insulated from each other by vertical insulating partition walls and the plates of each of which are separated by a dielectric layer in the form of an island, the dielectric layer and the vertical insulating partition walls having been obtained by local anodic oxidation of a superficial layer of the lower plate of the said capacitors through apertures provided in a layer of insulating material covering the said plate, which device is characterized in that the outer surface of the local islands constituting the dielectric layer and that of the vertical insulating partition walls present at least in part a difference in level with respect to the surface of the lower plate of the capacitors, and in that the layer of insulating material covering the said plate is at right angles to the periphery of the recesses thus formed.

* * * * *